United States Patent
White (10) Patent No.: US 10,190,693 B2
(45) Date of Patent: Jan. 29, 2019

(54) DOOR SEAL FOR VACUUM CHAMBER

(71) Applicant: Applied Materials, Inc., Santa Clara, CA (US)

(72) Inventor: John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/681,825

(22) Filed: Aug. 21, 2017

(65) Prior Publication Data

US 2018/0051811 A1     Feb. 22, 2018

Related U.S. Application Data

(60) Provisional application No. 62/377,934, filed on Aug. 22, 2016.

(51) Int. Cl.
| | |
|---|---|
| *F16K 1/20* | (2006.01) |
| *F16K 1/46* | (2006.01) |

(Continued)

(52) U.S. Cl.
CPC ............ *F16K 1/2057* (2013.01); *F16J 15/46* (2013.01); *F16K 1/465* (2013.01); *F16K 51/02* (2013.01); *H01L 21/67126* (2013.01)

(58) Field of Classification Search
CPC ........ F16K 1/2057; F16K 1/465; F26B 21/00; H01J 37/32

(Continued)

(56) References Cited

U.S. PATENT DOCUMENTS

| | | | | |
|---|---|---|---|---|
| 3,610,872 A | * | 10/1971 | Sciaky | B23K 15/06 219/121.13 |
| 3,638,674 A | * | 2/1972 | Forst | F16K 1/228 137/375 |

(Continued)

FOREIGN PATENT DOCUMENTS

| | | |
|---|---|---|
| CN | 102713374 A | 10/2012 |
| EP | 0 434 221 A1 * | 6/1991 |

(Continued)

OTHER PUBLICATIONS

International Search Report and Written Opinion for PCT/US2017/047516 dated Nov. 30, 2017.

(Continued)

*Primary Examiner* — Stephen M Gravini
(74) *Attorney, Agent, or Firm* — Patterson + Sheridan, LLP (57) ABSTRACT

Vacuum chambers having inflatable slit valve opening seals are described herein. In one example, a vacuum chamber includes a chamber body, a first inflatable seal, and a first slit valve door. The chamber body has a top, a bottom, and sidewalls. A first slit valve opening is formed in the sidewalls. The first inflatable seal is sealingly coupled to the sidewall and circumscribes the first slit valve opening. The first inflatable seal has a base coupled to the sidewall and a hollow tubular portion that can move laterally relative to the base. The first slit valve door is moveable between a close state that contacts the first inflatable seal to provide a vacuum seal between the first slit valve door and chamber body, and an open state that positions the first slit valve door clear of the first slit valve opening.

19 Claims, 5 Drawing Sheets

(51) Int. Cl.
*F16K 51/02* (2006.01)
*F16J 15/46* (2006.01)
*H01L 21/67* (2006.01)

(58) Field of Classification Search
USPC .......................................................... 34/242
See application file for complete search history.

(56) References Cited

U.S. PATENT DOCUMENTS

| | | | | |
|---|---|---|---|---|
| 4,080,526 | A * | 3/1978 | Kihara | H01J 37/18 |
| | | | | 219/121.21 |
| 5,000,905 | A | 3/1991 | Cox et al. | |
| 5,425,742 | A * | 6/1995 | Joy | A61H 35/00 |
| | | | | 601/152 |
| 6,000,905 | A * | 12/1999 | Toro-Lira | H01J 37/32743 |
| | | | | 414/217 |
| 6,475,357 | B2 | 11/2002 | Lakshmikanthan et al. | |
| 6,513,366 | B1 * | 2/2003 | Stauffer | G01M 3/329 |
| | | | | 73/49.3 |
| 6,913,650 | B2 * | 7/2005 | Gilmore | B05C 3/02 |
| | | | | 118/423 |
| 7,367,139 | B2 * | 5/2008 | Ando | F26B 5/04 |
| | | | | 34/209 |
| 8,641,014 | B2 * | 2/2014 | White | F16K 51/02 |
| | | | | 251/175 |
| 9,145,611 | B2 * | 9/2015 | Kurita | H01J 37/32899 |
| 9,383,037 | B2 * | 7/2016 | Duelli | F16J 15/46 |
| 9,534,294 | B2 * | 1/2017 | Ries | C23C 16/4405 |
| 2001/0054484 | A1 | 12/2001 | Komino | |
| 2004/0089231 | A1 * | 5/2004 | Gilmore | B05C 3/02 |
| | | | | 118/425 |
| 2006/0283041 | A1 | 12/2006 | Ando et al. | |
| 2008/0110568 | A1 | 5/2008 | Son | |
| 2008/0141940 | A1 | 6/2008 | Hoffman | |
| 2010/0194009 | A1 * | 8/2010 | Fullwood | B25B 11/005 |
| | | | | 269/9 |
| 2014/0072725 | A1 | 3/2014 | Kurita | |
| 2018/0051811 | A1 * | 2/2018 | White | F16K 1/465 |

FOREIGN PATENT DOCUMENTS

| | | | | |
|---|---|---|---|---|
| GB | 1342097 A | * | 12/1973 | ............ B65F 1/0093 |
| KR | 20120126064 A | * | 11/2012 | ................ F16J 15/46 |
| TW | 200739670 A | | 10/2007 | |
| TW | 1407031 B | | 9/2013 | |
| TW | M476362 U | | 4/2014 | |
| WO | WO 9606725 A1 | * | 3/1996 | ........... B29C 53/025 |
| WO | WO 2011091451 A1 | * | 8/2011 | ................ F16J 15/46 |

OTHER PUBLICATIONS

Taiwan Office Action dated Nov. 19, 2018 for Application No. 106128156.

* cited by examiner

DOOR SEAL FOR VACUUM CHAMBER

CROSS-REFERENCE TO RELATED APPLICATIONS

This application claims benefit of U.S. Provisional Application Ser. No. 62/377,934, filed Aug. 22, 2016, of which is incorporated by reference in its entirety.

BACKGROUND

Field

Implementations described herein generally relate to door seal for a vacuum chamber, and more specifically, vacuum chambers having the same.

Description of the Related Art

Plasma display panels, liquid crystal displays, solar panels, organic light emitting diodes (OLED) display are frequently used for displays and solar panels. During manufacturing of displays and solar panels, a large area substrate must be transferred from an atmospheric environment of a factory interface to a vacuum environment of a processing system in which the substrate is processed. Load lock chambers are utilized to receive the substrate from the atmospheric environment, pump down to a vacuum state, then introduce the substrate to vacuum environment of the processing system. Selective isolation of the load lock chamber from the atmospheric and vacuum environments is accomplished using slit valves.

The slit valves generally include a seal that contacts sealing surfaces of the slit valve door and a slit valve seal plate that is affixed to or part of the load lock chamber. Due to pressure differences when the load lock chamber is pumped down to a vacuum state, vented to atmosphere and pumped down to a vacuum state again, chamber body and door may flex slightly, thereby causing the slit valve door and the slit valve seal plate to move relative to each other. When the door and seal plate move relative each other, the seals, such as o-rings or sealing gaskets utilized to provide the vacuum seal between the door and seal plate, may rub or slide against one of these surfaces, thereby undesirably generating unwanted particles which may become a processing contaminant. Moreover, the rubbing reduces the life of the seals, necessitating more frequent seal replacement.

Thus, there is a need for an improved slit valve door seal for a vacuum chamber.

SUMMARY

Implementations described herein include vacuum chambers having inflatable slit valve seals. In one example, a vacuum chamber includes a chamber body, a first inflatable seal, and a first slit valve door. The chamber body has a top, a bottom, and sidewalls. A first slit valve opening is formed in the sidewalls. The first inflatable seal is sealingly coupled to the sidewall and circumscribes the first slit valve opening. The first slit valve door is moveable between a close state that contacts the first inflatable seal to provide a vacuum seal between the first slit valve door and chamber body, and an open state that positions the first slit valve door clear of the first slit valve opening. The first inflatable seal has a base coupled to the sidewall and a hollow tubular portion that can move laterally relative to the base when the slit valve door is in the closed state.

In another example, the vacuum chamber further includes a second slit valve opening formed through the sidewall, a second slit valve door moveable between closed and open positions, and a second inflatable sea. In the open position, the second slit valve door is clear of the second slit valve opening to allow substrate passage. The second inflatable seal is positioned to seal the second slit valve opening when the second slit valve door is in the closed position, e.g., the closed state.

In yet another example, a vacuum chamber is provided that includes a chamber body, a first slit valve door, a first inflatable seal and a seal clamp. The chamber body has a top, a bottom, and sidewalls. The sidewalls have at least a first slit valve opening formed therein. The first slit valve door is moveable between a close state and an open state. The first slit valve door is positioned clear of the first slit valve opening when in the open state. The first inflatable seal is disposed between the first slit valve door and the chamber body, and circumscribes the first slit valve opening. The first inflatable seal has a base coupled to a hollow tubular portion by a neck. The hollow tubular portion provides a seal between the first slit valve door and the chamber body when the first slit valve door is in the closed position. The hollow tubular portion of the first inflatable seal has a durometer of less than about 90 Shore A. The seal clamp has a recess having a width at least 5 percent wider than a width of the hollow tubular portion. The recess has an aperture through which the neck extends hollow tubular portion that can move laterally relative to the base, the width of the recess sufficient to allow the hollow tubular portion to roll relative to the base when the first slit valve door moves laterally relative to the base while the first slit valve door is in the closed position.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide an inflatable door seal utilized to provide robust sealing between a vacuum chamber and a slit valve door utilized to seal a slit valve opening formed through a chamber body of the vacuum chamber. Advantageously, the inflatable door seal mounted to the chamber body or door in a manner that allows the seal to roll slightly without rubbing on the chamber body or door during conditions in which the chamber body and door experience some relative motion when the door is in a closed position, thereby significantly reducing the potential for particle generation while extending the life of the seal.

Although the inflatable door seal is particularly suitable for vacuum chambers are utilized to seal between vacuum and ambient environments such as load lock chambers, the inflatable door seal may be utilized in other types of vacuum chambers, such as transfer chambers, processing chambers, and the like.

Figure 1:
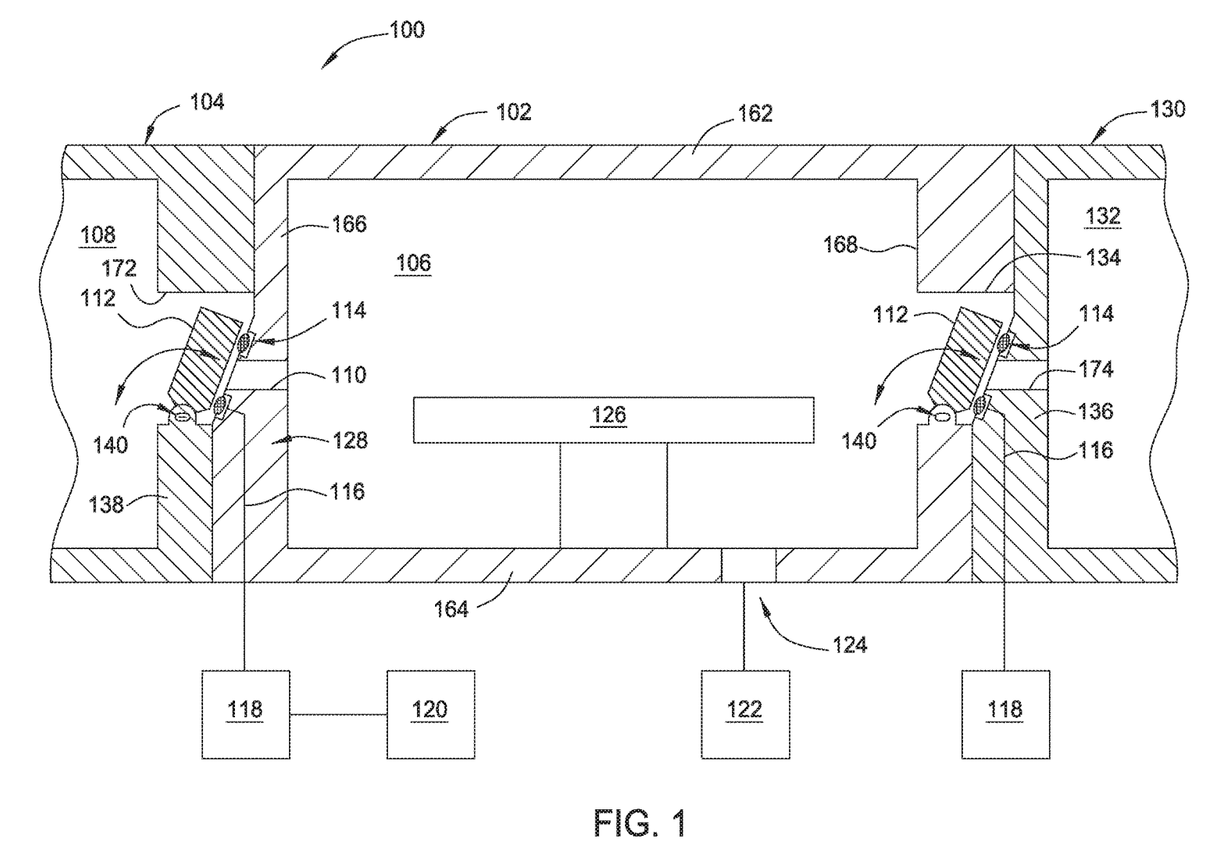
FIG. 1 is a partial sectional view of a vacuum processing system having a load lock chamber coupling a factory interface to a transfer chamber.

FIG. 1 is a partial sectional view of a vacuum processing system 100 having a load lock chamber 102 coupling a factory interface 104 to a transfer chamber 130. Although not shown, at least one or more processing chambers are coupled to the transfer chamber 130. An interior 108 of the factory interface 104 is generally maintained at an atmospheric environment while an interior 132 the transfer chamber 130 is generally maintained under vacuum.

The load lock chamber 102 includes a chamber body 128 suitable for maintaining a vacuum within an interior volume 106 of the chamber body 128. A substrate support 126 is disposed within the interior volume 106 of the chamber body 128 and is configured to facilitate exchange of a substrate (not shown) with a factory interface robot disposed within the factory interface 104 and a vacuum robot disposed within the transfer chamber 130 as conventionally known.

A pressure control system 122 is coupled to the load lock chamber 102 through one or more ports 124 formed through the chamber body 128. The pressure control system 122 is configured to pump down the interior volume 106 of the chamber body 128 to a predefined vacuum condition when substrates are exchanged between the load lock chamber 102 and the transfer chamber 130. The pressure control system 122 is configured to vent the interior volume 106 of the chamber body 128 to an atmospheric condition when substrates are exchanged between the load lock chamber 102 and the factory interface 104. The pressure control system 122 includes various pumps, flow controllers and valves to facilitate changing the pressure with the interior volume 106 of the chamber body 128 as conventionally known.

The chamber body 128 includes a top 162, a bottom 164, and sidewalls 166, 168. A first slit valve opening 110 is formed through one of the sidewalls (for example, sidewall 166) of the chamber body 128. The slit valve opening 110 is aligned with a passage 172 formed in the body 138 of the factory interface 104 connecting the interior volume 106 of the chamber body 128 with the interior 108 of the factory interface 104. A second slit valve opening 174 is formed through another one of the sidewalls (for example, sidewall 168). The second slit valve opening 174 is aligned with a passage 134 formed in the body 136 of the transfer chamber 130 connecting the interior volume 106 of the chamber body 128 and interior 132 of the transfer chamber 130. The slit valve openings 110, 174 generally are configured to accommodate passage of a substrate having a predefined size. In one embodiment, the substrate is a large area substrate such as utilized in solar, flat panel or OLED fabrication. In other embodiments, the substrate may be a semiconductor wafer or other substrate processed with a vacuum processing chamber.

A slit valve door 112 is disposed adjacent each slit valve opening 110, 174. Each slit valve door 112 connected to one of the chamber bodies 128, 136, 138 by a hinge 140. The slit valve door 112 is moveable (between a closed state and an open state) by an actuator (not shown), such as a motor or pneumatic cylinder disposed outside of the chamber body 128. In the closed state, the slit valve doors 112 seal the slit valve openings 110, 174 by contacting an inflatable seal 114 mounted to one of the chamber bodies 128, 136, 138, as further discussed below. In the open state, the slit valve door 112 moves clear, for example by rotation, of the slit valve openings 110, 174 to allow a substrate to be robotically transferred through the slit valve openings 110, 174 between chambers.

In the embodiment depicted in FIG. 1, one slit valve door 112 is connected to the chamber body 138 while the other slit valve door 112 is connected to the chamber body 128. In this arrangement, the slit valve door 112 is on the atmospheric side of the slit valve opening 110, 174 when one chamber is in a vacuum condition and the adjacent chamber is at atmosphere. In other embodiments, the slit valve door 112 may be mounted to the opposite chamber so that the slit valve door 112 opens in the opposite direction.

A fluid control system 118 is coupled to the inflatable seals 114. In one example, the fluid control system 118 is coupled to the inflatable seal 114 through a conduit 116 routed through the chamber body 128. The fluid control system 118 includes a pump and valves that allow the inflatable seal 114 to be controllably pressurized and vented. Control of the operation of the fluid control system 118 is provided by a controller 120, such as a programmable logic controller (PLC) or the like.

The fluid control system 118 is operable to maintain the inflatable seals 114 in an inflated condition when the door 112 is moved to and maintained in the closed state. The inflatable seals 114 may be maintained by the fluid control system 118 in an inflated condition when the door 112 is both in the open and closed states. In one embodiment, the fluid control system 118 is operable to adjust the pressure within the inflatable seals 114 from a lower pressure when the seal 114 is first contacted by the door 112, and then raised to a higher pressure when as the force contacting the door 114 against the seal 114 is increased after contact with the seal 114. In one embodiment, the fluid control system 118 is operable to adjust the pressure within the inflatable seals 114 to responsive changes in pressure differential across the door 112. In yet another embodiment, the fluid control system 118 is operable to adjust the pressure within the inflatable seals 114 to responsive changes in a closing force urging the door 112 to the closed position.

The inflatable seal 114 generally circumscribes the first slit valve opening 110. The inflatable seal 114 has a generally elongated rectangular shape suitable of allow a substrate having a predetermined size pass therethrough. In one example, the seal 114 is at least 2950 mm long by at least 140 mm wide. The inflatable seal 114 may be fabricated from a fluoropolymer elastomer, such as VITON®, perfluoroelastomer, such as KALREZ®, or other suitable elastomer. The inflatable seal 114 may have a durometer of less than about 90 Shore A, such as about 60 Shore A.

Figure 2:
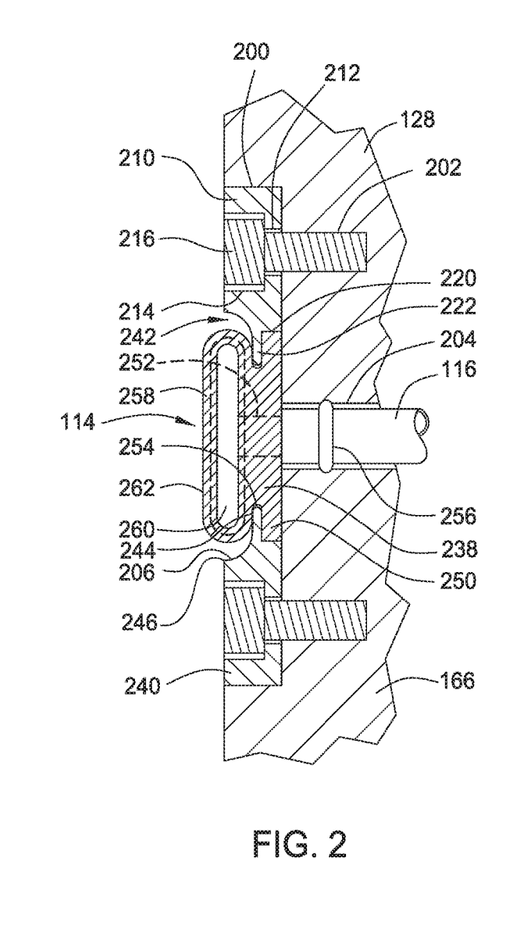
FIG. 2 is a partial sectional view of the load lock chamber illustrating an inflatable seal in a non-inflated state coupled to a chamber body of the load lock chamber.

FIG. 2 is a partial sectional view of the load lock chamber 102 illustrating the inflatable seal 114 in a non-inflated state coupled to the chamber body 128 of the load lock chamber 102. The inflatable seal 114 is mounted to the sidewall 166 of the chamber body 128 by a seal clamp 210. The sidewall 166 of the chamber body 128 includes a recess 200 that circumscribes the slit valve opening 110. The recess 200 is sized to receive the seal clamp 210. In one example, the recess 200 has a substantially rectangular shape and additionally has substantially rectangular profile. The conduit 116 coupling the fluid control system 118 (shown in FIG. 1) to the inflatable seal 114 may be routed through the recess 200 and seal clamp 210.

The seal clamp 210 may be fabricated from a rigid material suitable for use in a vacuum environment. In one embodiment, the seal clamp 210 is fabricated from aluminum or stainless steel.

The seal clamp 210 includes a mounting base 240. The mounting base 240 includes a plurality of holes 212. The holes 212 provide a passage for fasteners 216 that couple the mounting base 240 to the chamber body 128 by engaging a threaded hole 202 formed in the chamber body 128. The holes 212 may include a counter sink 214 for receiving a head of the fastener 216. In one embodiment, the seal clamp 210 is formed from two pieces, one along the inside diameter of the inflatable seal 114 and one along the outside diameter of the inflatable seal 114.

The seal clamp 210 also includes a bottom recess 220 and a top recess 242. The bottom recess 220 and top recess 242 are connected by an aperture 245 formed through a flange 222 that separates the recesses 242, 220.

The inflatable seal 114 includes a base 250 coupled to a hollow tubular portion 258 by a neck 238. The base 250 is sized slightly larger than the bottom recess 220 of the seal clamp 210 but smaller than the recess 200 so when the seal clamp 210 is fastened to the chamber body 128, the base 250 is compressed, thus creating vacuum seal with the chamber body 128.

The neck 238 extends through the aperture 245 formed through the flange 222 separating the recesses 242, 220. A passage 252 (shown in phantom) is routed through the neck 238 and base 250 and couples with the conduit 116. The conduit 116 is routed through a hole 204 formed through in the chamber body 128. The conduit 116 may include or be engaged with a seal 256 disposed in the hole 204. The passage 252 is fluidly connected to a hollow interior 260 of the tubular portion 258 so that fluid, such as air, nitrogen, water or other suitable fluid, and be selectively provided and removed by the fluid control system 118 to control the inflation/deflation of the tubular portion 258. In one embodiment, the fluid control system 118 may provide up to about 60 PSI or more of air to the hollow interior 260 of the tubular portion 258.

The tubular portion 258 of the inflatable seal 114 is partially disposed in the top recess 242 of the seal clamp 210. The tubular portion 258 includes an exterior sealing surface 262. The exterior sealing surface 262 is generally flat in its uninflated state, which helps maintain a good contact sealing surface when in use. The tubular portion 258 may also include a fabric core (shown by dashed line) to reinforces the polymer comprising the tubular portion 258. The tubular portion 258 and base 250 are generally larger than the aperture 245 so that the inflatable seal 114 is retained in the seal clamp 210.

The tubular portion 258 of the inflatable seal 114, when deflated, is generally smaller in width and a width of the top recess 242. The tubular portion 258 of the inflatable seal 114, when deflated, may has a height that is greater than a depth of the top recess 242.

To prevent damage to the tubular portion 258 of the inflatable seal 114, the intersection 206 between a bottom 244 and sidewalls 246 of the top recess 242 may include a radius. In one example, the intersection 206 may have a full radius that encompasses the entire height of the sidewalls 246.

Figure 3:
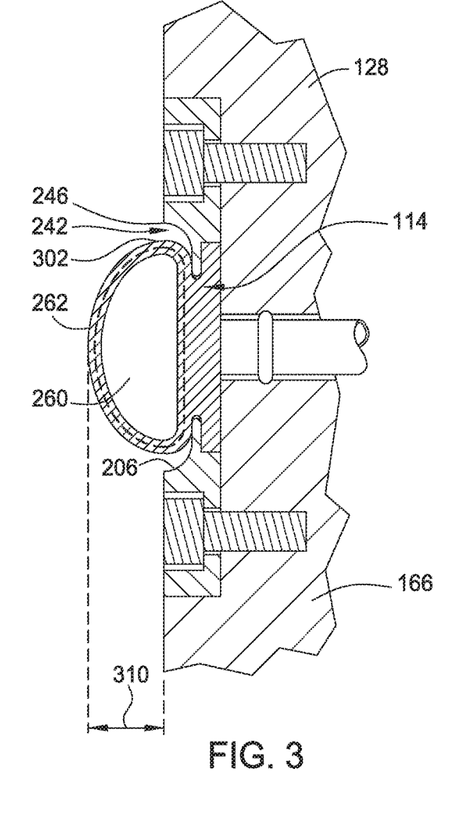
FIG. 3 is a partial sectional view of the chamber body of load lock chamber illustrating the inflatable seal in an inflated state.

FIG. 3 is a partial sectional view of the chamber body 128 of load lock chamber 102 illustrating the inflatable seal 114 in an inflated state. In the inflated state, the fluid control system 118 provides fluid to hollow interior 260 of the tubular portion 258, causing the tubular portion 258 to expand to a height 310 of at least 6 mm beyond the outer surface of the sidewall 166 of the chamber body 128. In one embodiment, the fluid control system 118 may provide up to about 60 PSI or more of air. In the inflated state, the sides 302 of tubular portion 258 move away from the sidewalls 246 of the top recess 242.

Figure 4:
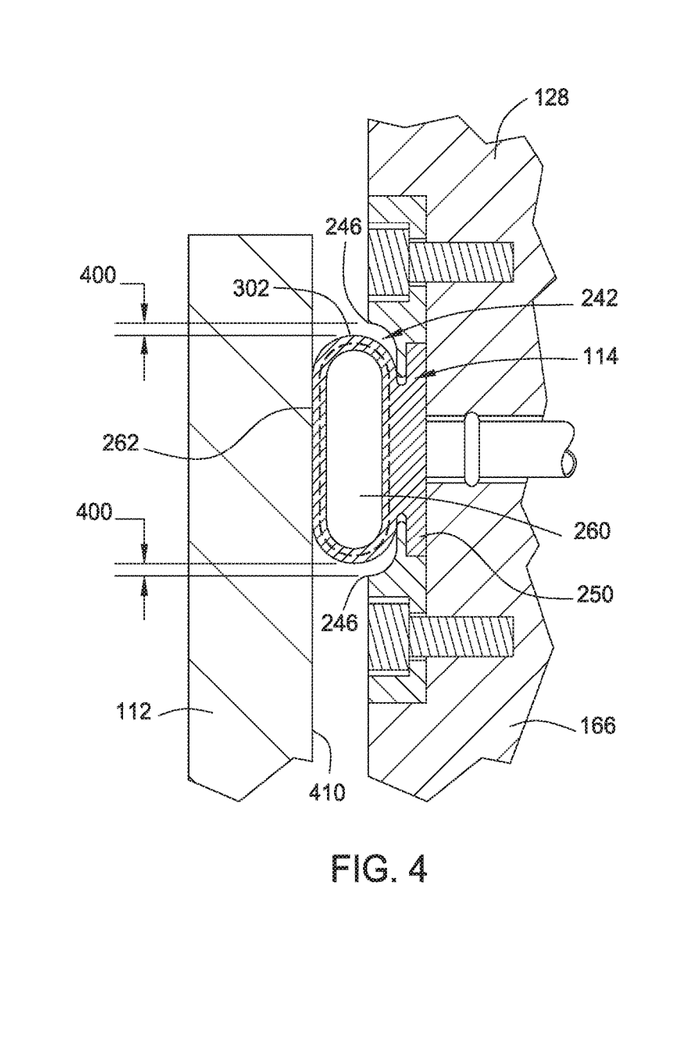
FIG. 4 is a partial sectional view of the inflatable seal mounted to the chamber body illustrating a state wherein a slit valve door is in a closed state.

FIG. 4 is a partial sectional view of the inflatable seal 114 in an inflated state when the slit valve door 112 is in the closed position and in contact with the inflatable seal 114. The force of the slit valve door 112 against the inflatable seal 114 caused the tubular portion 258 of the inflatable seal 114 to compress and widen slightly. However, since the top recess 242 is much wider than the tubular portion 258, the sides 302 of the tubular portion 258 remain clear of the sidewalls 246 of the top recess 242 by a distance 400 of at least 1 mm, for example, 1.5 mm or greater. For example, the top recess 242 of the seal clamp 210 has top recess 242 with a width of at least 1.4% greater than a width of the hollow tubular portion 258 when the inflatable seal 114 is in an inflated state. The width of the hollow tubular portion 258 is defined in parallel to the base 250.

The distance 400 allows the tubular portion 258 to roll laterally at least 1.4% of the width of the hollow tubular portion 258 when the inflatable seal 114 is in an inflated state. For example, the hollow tubular portion 258 may move laterally 1 mm or more relative to the base 250 when the slit valve door 112 moves laterally relative to the chamber body 128 while the slit valve door 112 is in the closed state, as illustrated by arrows 510 depicted in FIG. 5. In another example, the hollow tubular portion 258 may move laterally 2 mm relative to the base 250 when the slit valve door 112 moves laterally relative to the chamber body 128 while the slit valve door 112 is in the closed state, as illustrated by arrows 510 depicted in FIG. 5.

Figure 5:
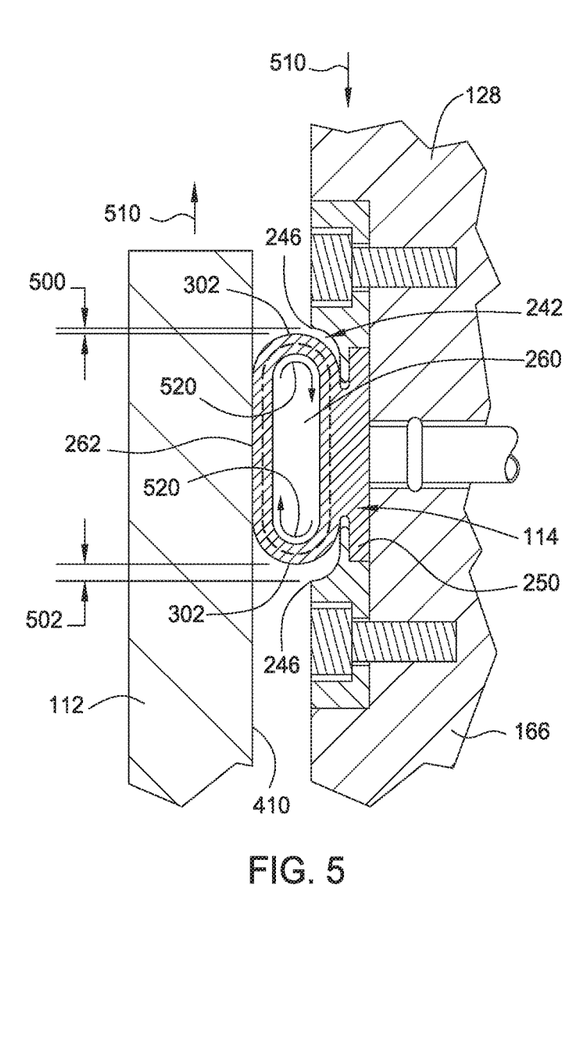
FIG. 5 is a partial sectional view of the inflatable seal mounted to the chamber body illustrating a state wherein the chamber body has moved relative to the slit valve door while the slit valve door is in the closed state.

As shown in FIG. 5, the flat exterior sealing surface 262 makes good sealing contact with the slit valve door 112 and thereby provides sufficient friction that causes the tubular portion 258 to roll in a tank tread or caterpillar track-like manner, as shown by arrows 520, thereby allowing the tubular portion 258 to move laterally relative to the base 250 while the exterior sealing surface 262 of the tubular portion 258 remains in non-sliding contact with the slit valve door 112 and while the bottom of portion of the tubular portion 258 remains in non-sliding contact with the seal clamp 210. Thus, the inflatable seal 114 will accommodate relative motion between the slit valve door 112 and the chamber body 128 while the slit valve door 112 is in the closed state.

The distance 400 is generally selected to allow a distance 500 on the side of the inflatable seal 114 in which the slit valve door 112 to be large enough to ensure that the side 302 of the inflatable seal 114 remains clear of the sidewalls 246 of the top recess 242 when the slit valve door 112 has moved a predefined distance. A distance 502 on the opposite side of the inflatable seal 114 conversely grows larger than the distance 400 as the distance 500 becomes smaller than distance 400.

Figure 7:
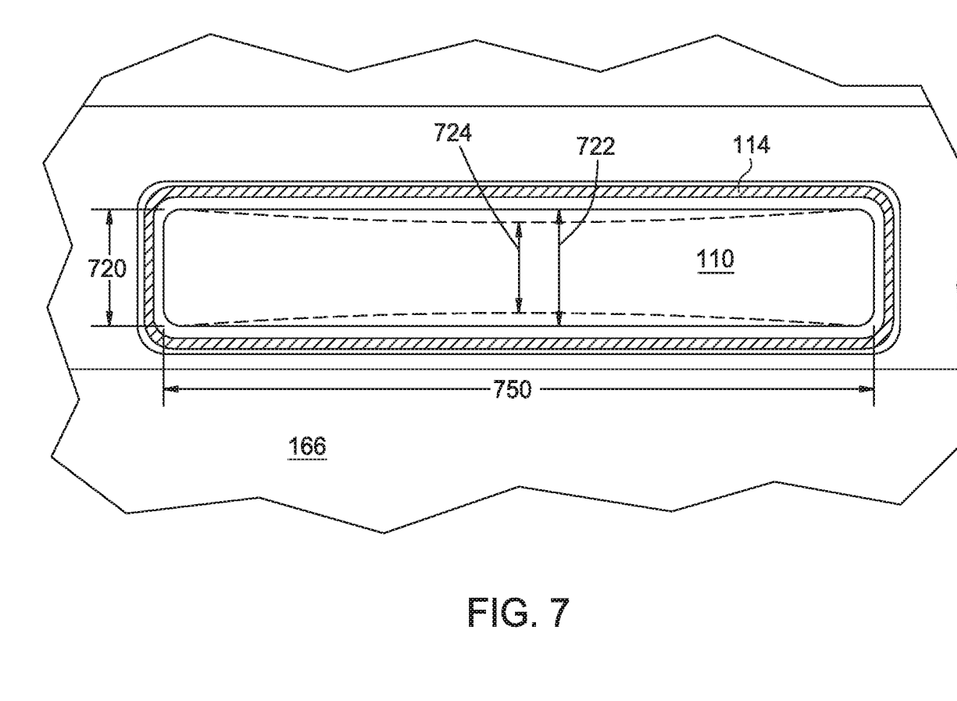
FIG. 7 is a partial plan view of the load lock chamber showing the slit valve opening.

Turning briefly to FIG. 7 to illustrate the movement of the inflatable seal 114 in the recess 242, FIG. 7 is a partial plan view of the load lock chamber 102 showing the slit valve opening 110. The load lock chamber 102 may be at an elevated pressure when the slit valve door 112 is in an open position, e.g., the open state. When the slit valve door 112 is moved into the closed position, the pressure within the load lock chamber 102 is pumped down to about vacuum pressure. The slit valve opening 110 has a height 720 and a width 750 configured to accommodate a substrate to transfer therethrough.

As the load lock chamber 102 is pumped down to vacuum pressure, the slit valve opening 110 may deform due to the differential pressure forces acting on the top 162, bottom 164, and sidewalls 166, 168 of the chamber body 136. Due to the height 720 of the slit valve opening 110 being much smaller than width 750, the slit valve opening 110 has a compressed height 724 when under vacuum from an original height 722 at atmospheric pressure along the center portion of the slit valve opening 110. In some embodiments, there may be as much as a 2 mm change in the height 720 when the sidewalls 166, 168 deflect to the compressed height 724 under the compression pressure load on the top 162, bottom 164, and sidewalls 166, 168 of the chamber body 136. For example, the original height 722 of height 720 may be between about 50 mm and about 200 mm, such as about 120 mm when the chamber 102 is at atmospheric pressure. Upon pumping the chamber 102 down to a vacuum pressure, the height 720 of the slit valve opening 110 may be the same as the original height 722 proximate the ends of the opening 110, but defects along the width 750, i.e., as shown by the compressed height 724. The compressed height 724 may be about 1.5 mm smaller than the original height 722.

Due to the much larger width 750 of the opening 110 relative to the height 720, the center of the opening 110 generally experiences more deflection. Thus, the inflatable seal 114 may deflect, i.e., roll or move laterally, more in center portions of straight lengths of the tubular portion 258 of the seal 114 rather than portions proximate the corners of the tubular portion 258.

The top recess 242 advantageously permits the inflatable seal 114 to roll with the movement of the sidewall 166 as the slit valve opening 110 slightly deforms under pressure from the height 720 to the small height 720 while the slit valve door is in contact with the seal 114. Thus, as the chamber cycles between atmospheric and vacuum pressure, the seal 114 accommodates the movement of the sidewall 166, 168 relative to the slit valve door 112 which substantially prevents the seal 114 from rubbing. By accommodating the movement of the sidewall 166, 168, particle generation from the seal 114 can be minimized or eliminated. Furthermore, the ability of the seal 114 to roll and accommodate relative motion between the door 112 and the sidewalls 166, 168 without rubbing reduces seal wear and extends the preventative maintenance interval and system uptime.

The inflatable seal 114 shown mounted to the chamber body 136 is similarly mounted and operated.

Figure 6:
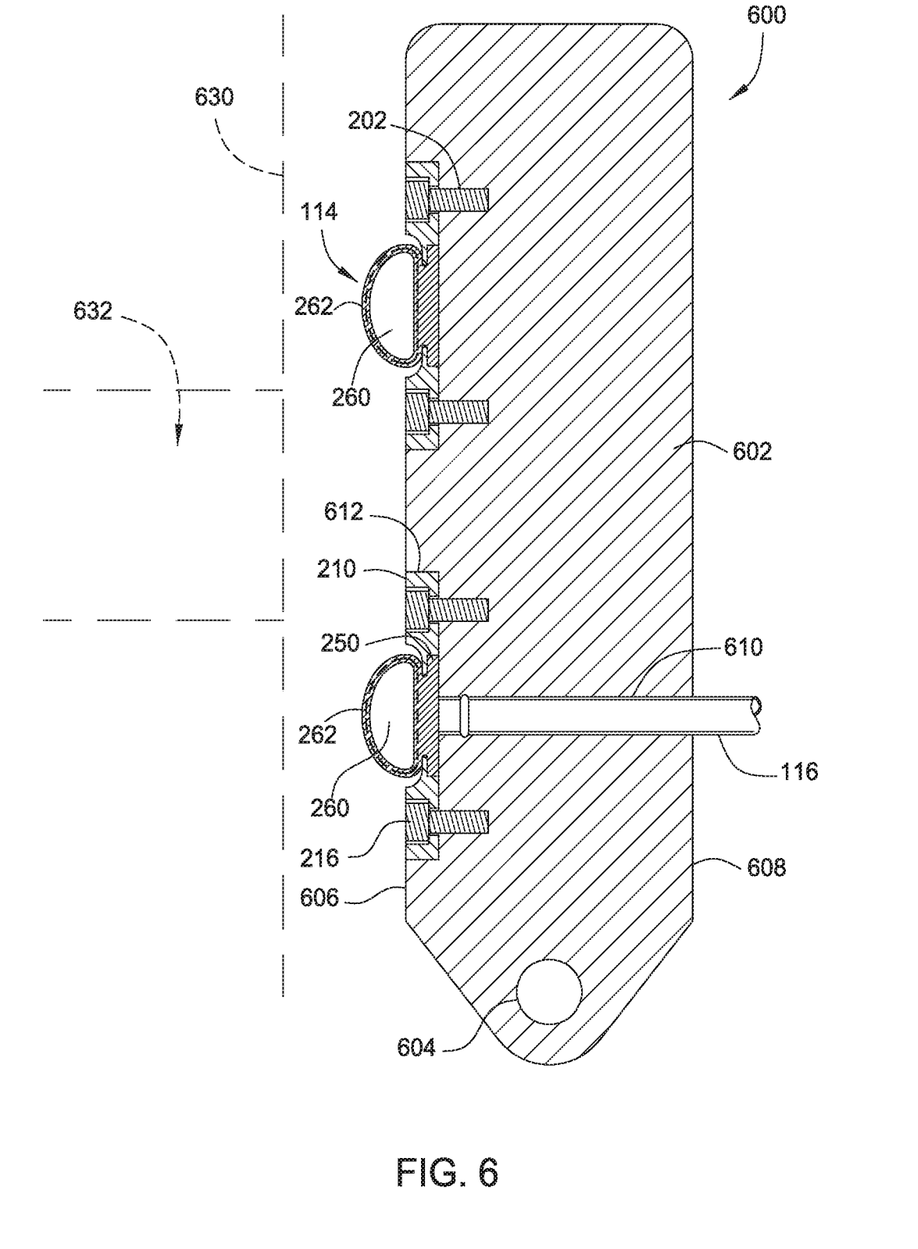
FIG. 6 is a sectional view of a slit valve door having an inflatable seal.

FIG. 6 is a sectional view of a slit valve door 600 having an inflatable seal 114. The slit valve door 600 generally includes a recess 612 that accepts the inflatable seal 114 and seal clamp 210. The inflatable seal 114 mounted to the door 600 is coupled by a conduit 116 to a fluid control system as discussed above.

The slit valve door 600 includes a body 602 includes a pivot hole 604 that accommodates a shaft that forms part of a hinge that allows the door 600 to move between closed and open states as described above. The body 602 has a back surface 608 and a sealing face 606. The sealing face 606 faces a wall 630 of an adjacent vacuum chamber such that, when the door 600 is in the closed state, the inflatable seal 114 contact the wall 630 and circumscribes a slit valve opening 632 formed in the wall 630.

The recess 612 is formed in the sealing face 606 and receives the inflatable seal 114 and seal clamp 210 in the same manner as described above with reference to FIGS. 2-5.

Advantageously, an inflatable door seal has been described that provides robust sealing between a vacuum chamber body and a slit valve door. Advantageously, the inflatable door seal accommodates lateral movement between the vacuum chamber body and the closed slit valve door without rubbing, thereby significantly reducing the potential for particle generation while extending the life of the seal.

While the foregoing is directed to implementations of the present invention, other and further implementations of the invention may be devised without departing from the basic scope thereof, and the scope thereof is determined by the claims that follow.

What is claimed is:

1. A vacuum chamber comprising:
    a chamber body having a top, a bottom, and sidewalls, the sidewalls having at least a first slit valve opening formed therein;
    a first inflatable seal sealingly coupled to a first sidewall of the sidewalls and circumscribing the first slit valve opening; and
    a first slit valve door moveable between a close state that contacts the first inflatable seal to provide a vacuum seal between the first slit valve door and chamber body, and an open state that positions the first slit valve door clear of the first slit valve opening, the first inflatable seal having a base coupled to the first sidewall and a hollow tubular portion that can move laterally relative to the base when the first slit vale door is in the closed state wherein the hollow tubular portion of the first inflatable seal has a durometer of less than about 90 Shore A.

2. The vacuum chamber of claim 1 further comprising:
    a seal clamp sealingly clamping the base of the first inflatable seal to the chamber body.

3. The vacuum chamber of claim 2, wherein the sidewalls of the chamber body further comprises:
    a groove receiving the seal clamp.

4. The vacuum chamber of claim 2, wherein the seal clamp comprises:
    a recessed portion having an aperture, a neck of the first inflatable seal extending through the aperture, the neck coupling the base to the hollow tubular portion.

5. A vacuum chamber comprising:
    a chamber body having a top, a bottom, and sidewalls, the sidewalls having at least a first slit valve opening formed therein;
    a first inflatable seal sealingly coupled to a first sidewall of the sidewalls and circumscribing the first slit valve opening; and a first slit valve door moveable between a close state that contacts the first inflatable seal to provide a vacuum seal between the first slit valve door and chamber body, and an open state that positions the first slit valve door clear of the first slit valve opening, the first inflatable seal having a base coupled to the first sidewall and a hollow tubular portion that can move laterally relative to the base when the first slit vale door is in a closed state, wherein the hollow tubular portion is configured to roll laterally relative to the base over a distance of at least 1.4% of a diameter of the hollow tubular portion when the first inflatable seal in an inflated state.

6. The vacuum chamber of claim 5, wherein the distance is at least 1 mm.

7. The vacuum chamber of claim 4, wherein the first inflatable seal comprises:
a conduit for inflating the first inflatable seal, the conduit extending from the base through the recessed portion formed in the sidewalls.

8. The vacuum chamber of claim 1 further comprising:
a second slit valve opening formed through the sidewalls;
a second slit valve door moveable between closed and open positions, the second slit valve door clear of the second slit valve opening when in the open position; and
a second inflatable seal positioned to seal the second slit valve opening when the second slit valve door is in the closed position.

9. The vacuum chamber of claim 8 further comprising:
a pressure control system coupled to the chamber body, the pressure control system adapted to pump down the chamber body to a vacuum condition and vent the chamber body to an atmospheric condition.

10. The vacuum chamber of claim 1, wherein the first inflatable seal faces away from an interior of the chamber body and the second inflatable seal faces the interior of the chamber body.

11. A vacuum chamber comprising:
a chamber body having a top, a bottom, and sidewalls, the sidewalls having at least a first slit valve opening formed therein;
a first slit valve door moveable between a close state and an open state, the first slit valve door positioned clear of the first slit valve opening when in the open state;
a first inflatable seal disposed between the first slit valve door and the chamber body, the first inflatable seal having a base coupled to a hollow tubular portion by a neck, the hollow tubular portion providing a seal between the first slit valve door and the chamber body when the first slit valve door is in a closed state, the hollow tubular portion of the first inflatable seal having a durometer of less than about 90 Shore A; and
a seal clamp having a recess having a width at least 1.4% wider than a width of the hollow tubular portion, the recess having an aperture through which the neck extends hollow tubular portion that can move laterally relative to the base, the width of the recess sufficient to allow the hollow tubular portion to deform in a rolling fashion relative to the base when the first slit valve door moves laterally relative to the base while the first slit valve door is in the closed state.

12. The vacuum chamber of claim 11, wherein the first slit valve door further comprises:
a recess accepting the seal clamp therein, the recess having an aperture through which a conduct coupled to the first inflatable seal to the chamber body is disposed.

13. The vacuum chamber of claim 11 further comprising:
a second slit valve opening formed through the sidewalls;
a second slit valve door moveable between closed and open positions, the second slit valve door clear of the second slit valve opening when in the open state; and
a second inflatable seal positioned to seal the second slit valve opening when the second slit valve door is in the closed position.

14. The vacuum chamber of claim 13, wherein the first inflatable seal faces away from an interior of the chamber body and the second inflatable seal faces the interior of the chamber body.

15. The vacuum chamber of claim 14 further comprising:
a pressure control system coupled to the chamber body, the pressure control system adapted to pump down the chamber body to a vacuum condition and vent the chamber body to an atmospheric condition.

16. The vacuum chamber of claim 13 further comprising:
a factory interface coupled to the chamber body, the first slit valve opening configured to allow substrate transfer between the factory interface and the chamber body; and
a transfer chamber coupled to the chamber body, the first slit valve opening configured to allow substrate transfer between the transfer chamber and the chamber body.

17. The vacuum chamber of claim 11, wherein the hollow tubular portion is configured to roll laterally relative to the base over a distance of at least 1.4% of a diameter of the hollow tubular portion when the first inflatable seal in an inflated state.

18. The vacuum chamber of claim 17, wherein the distance is at least 1 mm.

19. The vacuum chamber of claim 11, wherein the first inflatable seal is coupled to the chamber body.

\* \* \* \* \*